United States Patent
Tekletsadik

(10) Patent No.: US 7,283,339 B2
(45) Date of Patent: Oct. 16, 2007

(54) SUPERCONDUCTING FCL USING A COMBINED INDUCTED MAGNETIC FIELD TRIGGER AND SHUNT COIL

(75) Inventor: Kasegn D. Tekletsadik, Rexford, NY (US)

(73) Assignee: SuperPower, Inc

( * ) Notice: Subject to any disclaimer, the term of this patent is extended or adjusted under 35 U.S.C. 154(b) by 0 days.

(21) Appl. No.: 11/436,870

(22) Filed: May 18, 2006

(65) Prior Publication Data
US 2006/0274458 A1 Dec. 7, 2006

Related U.S. Application Data

(60) Provisional application No. 60/686,378, filed on Jun. 1, 2005.

(51) Int. Cl.
*H02H 7/00* (2006.01)
(52) U.S. Cl. .......................... 361/19; 335/216
(58) Field of Classification Search ............... 361/19; 335/216
See application file for complete search history.

(56) References Cited

U.S. PATENT DOCUMENTS

| | | | |
|---|---|---|---|
| 5,525,583 A | 6/1996 | Aized et al. | |
| 5,914,647 A * | 6/1999 | Aized et al. | ........... 335/216 |
| 6,043,731 A | 3/2000 | McDougall et al. | |
| 6,664,875 B2 | 12/2003 | Yuan et al. | |
| 6,809,910 B1 | 10/2004 | Yuan et al. | |
| 2005/0099253 A1 | 5/2005 | Bock et al. | |

* cited by examiner

*Primary Examiner*—Michael Sherry
*Assistant Examiner*—Terrence R. Willoughby
(74) *Attorney, Agent, or Firm*—George L. Rideout, Jr.

(57) ABSTRACT

A single trigger/shunt coil is utilized for combined induced magnetic field triggering and shunt impedance. The single coil connected in parallel with the high temperature superconducting element, is designed to generate a circulating current in the parallel circuit during normal operation to aid triggering the high temperature superconducting element to quench in the event of a fault. The circulating current is generated by an induced voltage in the coil, when the system current flows through the high temperature superconducting element.

18 Claims, 9 Drawing Sheets

SUPERCONDUCTING FCL USING A COMBINED INDUCTED MAGNETIC FIELD TRIGGER AND SHUNT COIL

CROSS REFERENCE TO RELATED APPLICATIONS

This U.S. non-provisional application claims the benefit of U.S. provisional Patent Application, Ser. No. 60/686,378 entitled "Superconducting FCL Using A Combined Inducted Magnetic Field Trigger and Shunt Coil," filed on Jun. 1, 2005, having at least one co-inventor in common with this application.

The U.S. government has a paid-up license in this invention and the right in limited circumstances to require to the patent owner to license others on reasonable terms as provided for in the terms of Contract No. DE-FC36-03GO13033 awarded by the Department of Energy.

BACKGROUND

The invention relates generally to a current limiter and more specifically to a superconducting fault current limiter.

Current limiting devices are critical in electric power transmission and distribution systems. For various reasons such as lightening strikes, short circuit conditions can develop in various sections of a power grid causing sharp surge in current. If this surge of current, which is often referred to as fault current, exceeds the protective capabilities of the switchgear equipment deployed throughout the grid system, it could cause catastrophic damage to the grid equipment and customer loads that are connected to the system.

Superconductors, especially high-temperature superconducting (HTS) materials, are well suited for use in a current limiting device because of their intrinsic properties that can be manipulated to achieve the effect of "variable impedance" under certain operating conditions. A superconductor, when operated within a certain temperature and magnetic field range (i.e., the "critical temperature" ($T_c$) and "critical magnetic field" ($H_c$) range), exhibits no electrical resistance if the current flowing through it is below a certain threshold (i.e., the "critical current level" ($I_c$)), and is therefore said to be in a "superconducting state." However, if the current exceeds this critical current level the superconductor will undergo a transition from its superconducting state to a "normal resistive state." This transition of a superconductor from its superconducting state to a normal resistive state is termed "quenching." Quenching can occur if any one or any combination of the three factors, namely the operating temperature, magnetic field or current level, exceeds their corresponding critical level. Mechanisms, using any one or any combination of these three factors, to induce and/or force a superconductor to quench is usually referred to as a trigger mechanism.

A superconductor, once quenched, can be brought back to its superconducting state by changing the operating environment to within the boundary of its critical current, critical temperature and critical magnetic field range, provided that no damage was done during the quenching of the superconductor. HTS material can operate near the liquid nitrogen temperature 77 degrees Kelvin (77K) as compared with low-temperature superconducting (LTS) material that operates near liquid helium temperature (4K). Manipulating properties of HTS material is much easier because of its higher and broader operating temperature range.

For some HTS materials, such as BSCCO, YBCO, and $MgB_2$ there often exists, within the volume of the superconductor, non-uniform regions resulting from the manufacturing process. Such non-uniform regions can develop into the so-called "hot spots" during the surge of current that exceeds the critical current level of the superconductor. Essentially, at the initial stage of quenching by the current, some regions of the superconductor volume become resistive before others do due to non-uniformity. A resistive region will generate heat from its associated $i^2r$ loss. If the heat generated could not be propagated to its surrounding regions and environment quickly enough, the localized heating can damage the superconductor and could lead to the breakdown (burn-out) of the entire superconductor element.

U.S. Pat. No. 6,664,875, issued on Dec. 16, 2003, entitled, "Matrix-Type Superconducting Fault Current Limiter" (MFCL) assigned to the assignee of the present invention, incorporated by reference in its entirety, uses a mechanism that combines all three of the quenching factors of the superconductor, namely current, magnetic field and temperature, to achieve a more uniformed quenching of the superconductor during current limiting. This MFCL concept can dramatically reduce the burnout risks in bulk superconducting materials due to the non-uniformity which exists in the superconductor volume. In addition, the detection of a fault and subsequent activation of the current-limiting impedance of the MFCL are done passively by the built-in matrix design, without assistance of active control mechanisms. This makes a fault current limiter based on the MFCL concept more easily designed, built and operated for a wide range of potential current-limiting applications.

US Publication US2005/0099253A1, published on May 12, 2005, discloses a superconducting current limiting device comprising a superconductor body electrically connected in parallel with a shunt coil wherein the shunt coil is in tight contact with the external surface of the superconducting body. The shunt coil has an external shape to allow a circular current to flow. This publication does not disclose arranging the shunt coil so that it is not in tight contact with the external surface of the superconductor and yet function as a fault current limiter, nor does this publication disclose arranging the shunt coil at a predetermined range of angles to produce a circulating current.

U.S. Pat. No. 6,043,731, issued on Mar. 28, 2000, discloses a current limiting device having a superconductor, a shunt coil wrapped around the superconductor and connected in parallel with the superconductor, wherein the shunt coil generates a magnetic field to assist in quenching the superconductor. The shunt coil is controlled by active means. This patent does not disclose arranging the shunt coil at a predetermined range of angles to produce a circulating current. Nor does this patent disclose loosely winding the shunt coil around the superconductor.

U.S. Pat. No. 6,809,910, issued on Oct. 26, 2004, discloses a current limiting device having a superconductor, a shunt coil wrapped around the superconductor and connected in parallel with the superconductor, wherein the shunt coil generates a magnetic field to assist in quenching the superconductor. This patent does not disclose arranging the shunt coil at a predetermined range of angles to produce a circulating current, nor does this patent disclose loosely winding the shunt coil around the superconductor.

A magnetic field can be used to trigger High Temperature Superconducting (HTS) materials to improve speed and uniform quenching during transition from superconducting to normal resistive state. Excessive heating in HTS materials, caused by high fault currents, is minimized by using a shunt impedance to divert current from the HTS elements to the shunt impedance. In some Superconducting Fault Current Limiter (SCFCL) designs two external windings (coils) are used, one to generate the trigger magnetic field and one as a shunt impedance. The large number of components (parts) due to the use of two coils per HTS element adds to the complexity of the design and is problematic in areas of manufacturability, size, weight, winding and interconnection power loss, and high voltage design. The use of a single coil for both triggering and shunt reduces the complexity of the design.

As the need for higher power and higher voltage applications of Fault Current Limiters increases, designing a device with less complexity and yet using magnetic field for triggering becomes a challenge. Optimizing fault current limiter design with fewer overall components is important to design a reliable high voltage device at a transmission system level. As the power and voltage requirement increases, the number of components (superconductors and magnetic field coils) increase, which adds to the complexity of the device. Reducing the number of parts is one of the ways to improve reliability of the device. There therefore exists a need for a simplified design with improved reliability in a SCFLC device for transmission system applications.

BRIEF DESCRIPTION

Briefly, in accordance with one embodiment of the present invention, a single trigger/shunt coil is utilized for combined induced magnetic field triggering and shunt impedance. The single coil connected in parallel with the HTS element, is designed to generate a circulating current in the parallel circuit, which in turn produces a magnetic field to aid triggering the HTS element so as to quench in the event of a fault. The circulating current is generated by an induced voltage in the coil when the system current flows through the HTS element.

In accordance with the present invention, a superconducting fault current limiter is provided which has at least one HTS element coupled in parallel with a single trigger/shunt coil. The inductive component, herein referred to as trigger/shunt coil, is electrically connected in parallel with a superconductive element to form the base structure of the fault current limiter. Each element of the trigger/shunt coil is physically wound around the HTS so that there is an angle θ, defined by an orthogonal line to a centerline of the HTS element and a centerline running in parallel with the trigger/shunt coil element so as to generate an induced voltage in the trigger/shunt coil when the system current flows through the HTS element. Under this operating condition, the superconducting element has a current flowing through it generating a magnetic field across the trigger/shunt coil, which magnetic field in turn induces a voltage in the trigger/shunt coil and which generates a circulating current in the trigger/shunt coil which flows through the trigger/shunt coil and superconducting parallel circuit. The circulating current in the trigger/shunt coil generates a magnetic field which is in parallel with the HTS element and is used as a trigger magnetic field which causes the superconductor to enter a quenching mode faster than it would otherwise because of the circulating current and resulting magnetic field. This magnetic field is used as a pre-trigger magnetic field to increase the speed of the quench and help the HTS elements quench uniformly and hence reduce the creation of hot spots and improve the performance and the life expectancy of the HTS elements. Once there is a system fault, the current surge will exceed the critical current level of the superconductor element and cause it to quench very quickly, thus generating a sufficiently large voltage drop across the shunt coil which results in part of the fault current being diverted into the trigger/shunt coil. The resulting current in the trigger/shunt will generate an enhanced magnetic field that is uniformly applied to the superconductor which acts to help quench the superconductor uniformly. The trigger/shunt will also act to limit the voltage generated by the superconductor and share the total current to insure that the superconductor does not overheat and can quickly return to its normal state once the fault has been removed.

Using the arrangement described above as a base module, a series array superconducting fault current limiter is configured to have at least two modules, wherein each module electrically coupled in series with each other module. Such a base module can also be connected in parallel to with one or more such base modules to increase the power handling capacity. The modular nature of the superconducting fault current limiter makes it very desirable in high voltage and/or high current environments of the power system to which it connects.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

U.S. patent application Ser. No. 11/097,560, entitled "Self-Triggering Superconducting Fault Current Limiter", filed on Apr. 2, 2005, assigned to the assignee of the present invention, is herein incorporated by reference in its entirety. This application describes a FCL having a shunt and a trigger coil coupled in parallel with a superconductor which design is modular and scalable that functions as a "variable impedance" using components made of superconducting as well as conventional electrically conductive materials. U.S. Pat. No. 6,809,910, entitled "Method and Apparatus To Trigger Superconductors In Current Limiting Devices", issued on Oct. 26, 2004, assigned to the assignee of the present invention, is herein incorporated by reference in its entirety. This patent describes a FCL having a shunt and a trigger coil and provides details about the trigger coils and the triggering method and mechanism.

Figure 1:
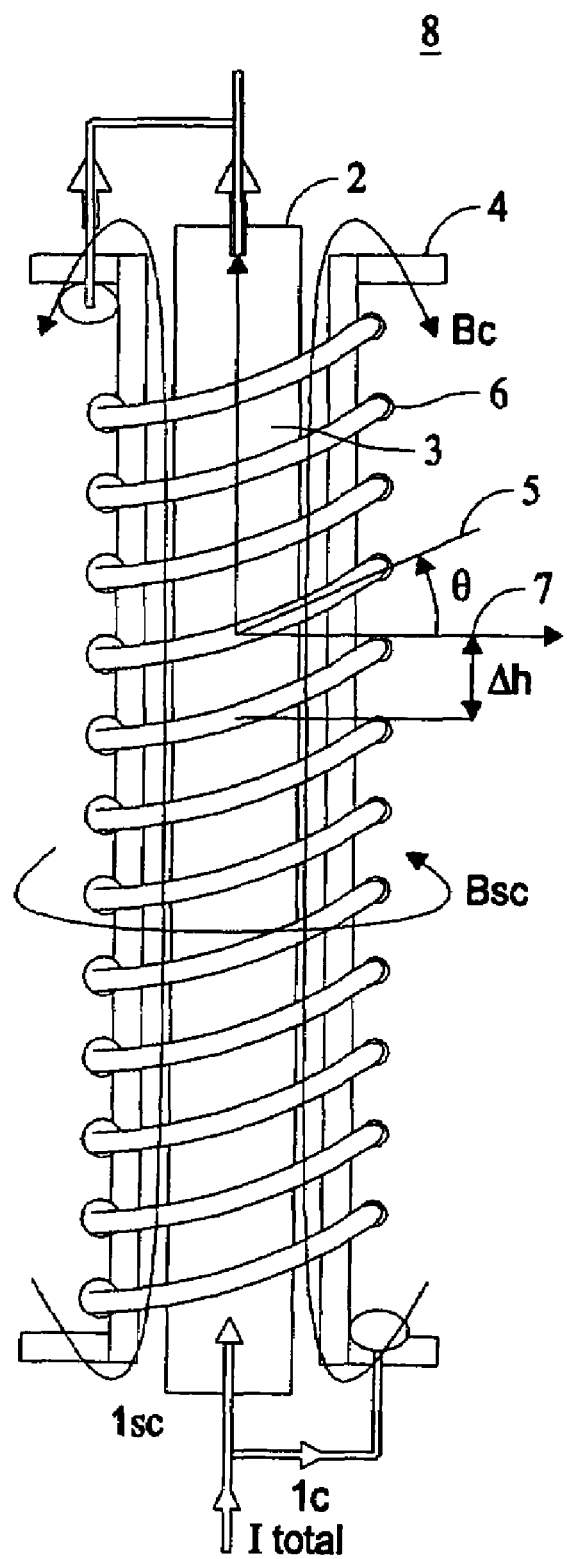
FIG. 1 illustrates a simplified physical layout of a basic fault current limiter of the present invention.
Figure 2:
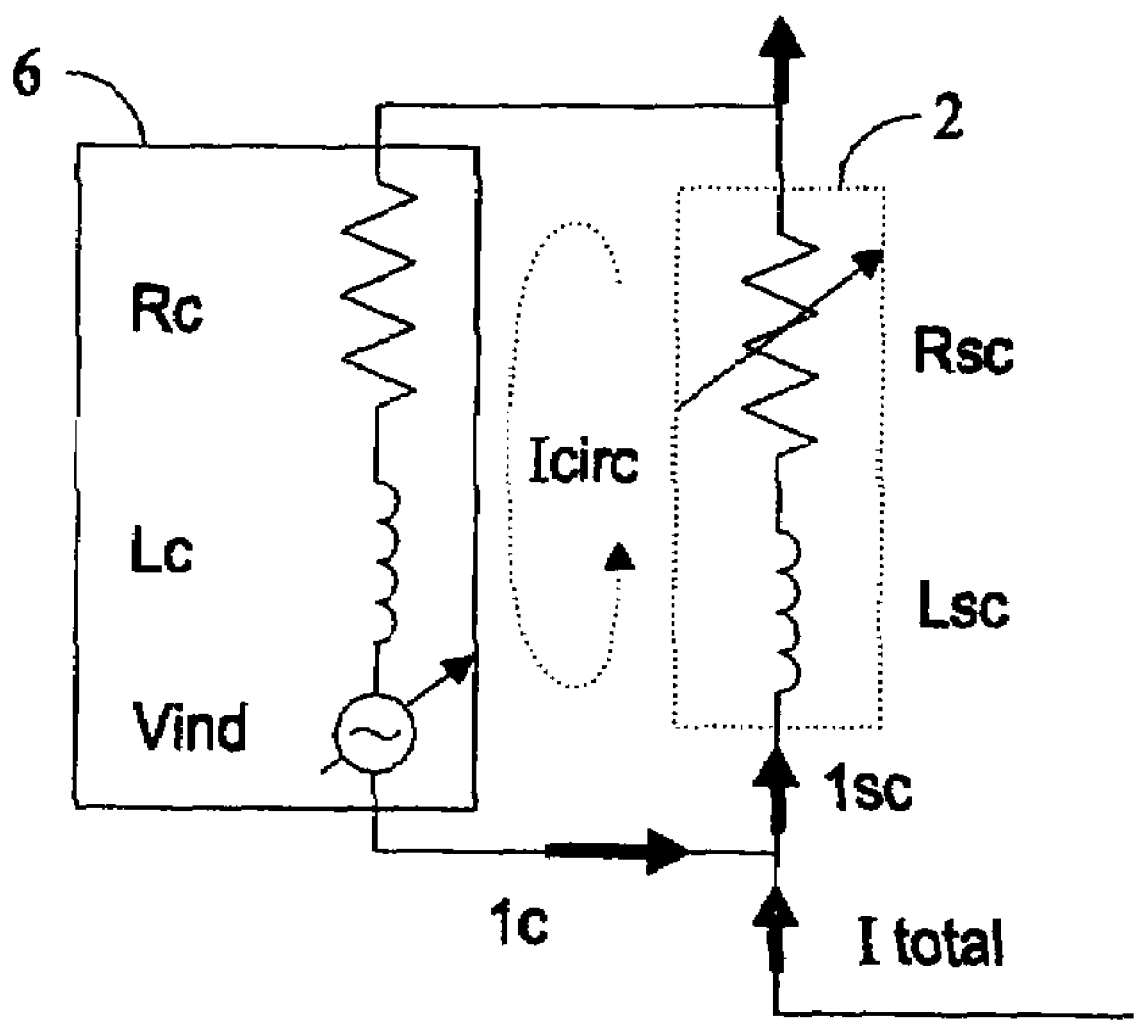
FIG. 2 illustrates a simplified electrical schematic block diagram of a basic fault current limiter of the present invention.

FIG. 1 illustrates a simplified physical layout of a superconducting fault current limiter 8 of the present invention. A trigger/shunt coil 6 physically envelops superconducting element 2, supported by a coil guide 4 disposed along the length of the superconducting element 2, to cause a uniformed magnetic field throughout the length of superconductor 2 when current flows through trigger/shunt coil 6. Trigger/shunt coil 6 comprises a resistance $R_c$ and inductance $L_c$, as illustrated in FIG. 2. Trigger/shunt coil 6 comprises a plurality of windings or elements and is made of electrically conductive materials, such as copper, and in configurations selected from the group including helically wound solenoid coils, racetrack coils or saddle coils. Trigger/shunt coil 6 is electrically coupled in parallel with superconducting element 2. Superconducting element 2 is a High Temperature Superconductor (HTS), comprising a single conductor or a combination of series and parallel connected conductors, selected from the group including a bar, a rod, a tube, a plate, a bifilar coil or other coil windings, a tape, a wire, or any other non or low-inductive forms. Superconductor element 2 comprises resistance $R_{sc}$ and an inductance $L_{sc}$. Each winding of trigger/shunt coil 6 envelopes HTS 2 in a particular manner such that an angle θ is generally maintained between each coil 6 winding or element and HTS 2. The angle θ is defined by the angle formed by a perpendicular line 7 to centerline 3 physically disposed near the center of HTS 2 and the centerline 5 physically disposed and about parallel to an element of trigger/shunt coil 6. It is understood that the angle θ varies between about 5 and about 85 degrees, is not a precise angle, but rather is defined by the resulting induced voltage in the trigger/shunt coil and the resulting circulating current that is generated between the impedance of HTS 2 and shunt 6 when the system current flows through the HTS element 2, as is further described herein. The superconductor 2 is maintained at a superconducting state by being cooled below its critical temperature with cooling provided by either liquid or gaseous coolant within a cryostat or by external cooling mechanisms such as cryocoolers or combinations of both (not shown), which are well known in the art and therefore not described further herein.

In accordance with one embodiment of the present invention, the single trigger/shunt coil 6 is designed to generate a circulating current $I_{circ}$ in the superconducting fault current limiter 8 to produce a triggering magnetic field to aid in triggering current limiter 8 to "quench" in the event of a fault. The circulating current $I_{circ}$ is generated by an induced voltage in the coil 6, when the system current flows through HTS element 2. This operation is characterized mathematically by the equivalent circuit equations present below.

The induced voltage in the trigger/shunt Coil 6 is defined as;

$$Vind = NA\frac{d(Bsc)}{dt} = k\frac{d(Isc)}{dt}$$

Where "k" is a constant, which depends on the angle of the coil conductor, θ, and may vary proportional to sin(θ).

The circulating current $I_{circ}$ in the parallel circuit loop is a solution to the differential equation $$Vind = (Lc + Lsc)\frac{d(Icirc)}{dt} + (Rc + Rsc)Icirc$$

$$Icirc = pI\_total$$

where "p" is a proportionality factor dependent on the angle of the coil conductor, θ, and the trigger magnetic field in parallel with HTS element 2 is;

Bc=g Icirc, where g is coil geometric constant

In general,
  Vind=f(I_total, N, θ, geometric factors)
  Icir=f(Vind, Lc, Rc, Rsc, Lsc)=p $I_{total}$ and
  Bc=f(Icir, geometric factors)=g Icirc Shunt/trigger coil 6 has dual functions including triggering the quenching state of superconductor 2 and to performing the shunt function to limit the maximum voltage drop that may develop across superconductor 2 after it quenches. A portion of the fault current is shunted away from superconductor element 2 into trigger/shunt coil 6 thus reducing the heat generated in the superconductor in the form of $i^2r$ losses to protect against potential thermal and mechanical damage. This also improves the thermal recovery of the superconductor 2 and therefore the recovery time of the fault current limiter 8 once the fault is removed, since the voltage development limited by trigger/shunt 6 also limits the energy and the temperature rise of superconducting element 2 during its quenching and subsequent states.

Variables identified in equivalent circuit 10 and SCFCL 8 of FIGS. 1 and 2 are defined next.
  $I_{total}$=Total system circuit current
  $V_{ind}$=Induced voltage in the trigger/shunt coil
  $I_{circ}$=Circulating current in the parallel circuit loop
  $R_{sc}$=Resistance of superconducting (SC) element 2
  $L_{sc}$=Inductance of superconducting element 2
  $R_c$=Trigger/shunt coil 6 resistance
  $L_c$=Trigger/shunt coil 6 iductance
  $B_{sc}$=Magnetic field generated by HTS 2
  $B_c$=Magnetic field generated by coil 6 due to $I_{circ}$
  N=Number of turns in trigger/shunt coil 6

θ=Angle of coil 6 winding relative to HTS 2
Δh=Coil 6 turn-to-turn gap The induced voltage is defined as; $V_{ind}$=f(I_total, N, Coil geometry, θ)≈kNAd(Isc)/dt, and the circulating current is defined as $I_{circ}$=f(Vind, Lc, Rc, Lsc, Rsc)="p" $I_{total}$, where "p"=proportional constant relative to $I_{total}$.

The principle of operation is to employ a trigger/shunt coil 6 whose winding is wound with an angle θ, or pre-defined turns pitch (coil turn-to-turn gap), Number of turns "N", and physical geometric dimensions to provide the required induced voltage to generate the required $I_{circ}$ to produce the pre-quench triggering magnetic field, and also to provide a trigger/shunt coil 6 impedance ($R_c$, $L_c$) to protect HTS 2 from excessive heating by diverting the fault current to the trigger/shunt impedance. The use of a magnetic field $B_c$ as a triggering mechanism is also to provide uniform quenching and fast response time, as described in further detail below.

The system current $I_{total}$ in HTS 2 generates a magnetic field $B_{sc}$, which induces voltage in trigger/shunt coil 6, which further generates a circulating current $I_{circ}$, which in turn produces a magnetic field $B_c$ that is in parallel with HTS 2. When HTS 2 is superconducting, the induced voltage $V_{ind}$ generates circulating current $I_{circ}$, which is limited by trigger/shunt coil 6 impedance $R_c$ and $L_c$. When HTS 2 is in a resistive state, both trigger coil 6 and HTS 2 limit the circulating current $I_{circ}$. The trigger/shunt coil design is optimized so that the circulating current, $I_{circ}$, is determined to produce an optimized pre-trigger magnetic field before the HTS element starts quenching due to exceeding the critical current and at the same time to minimize the coil ($I^{circ2}$ $R_c$) losses during normal operation.

Figure 3:
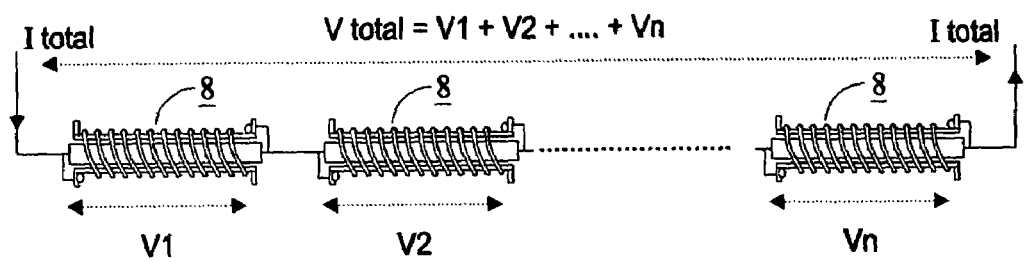
FIG. 3 illustrates an embodiment of the series array arrangement of the present invention to form a superconducting fault current limiter array wherein a trigger/shunt impedance is coupled in parallel with a superconducting element within each fault current limiter module of the superconducting fault current limiter of the present invention.
Figure 4:
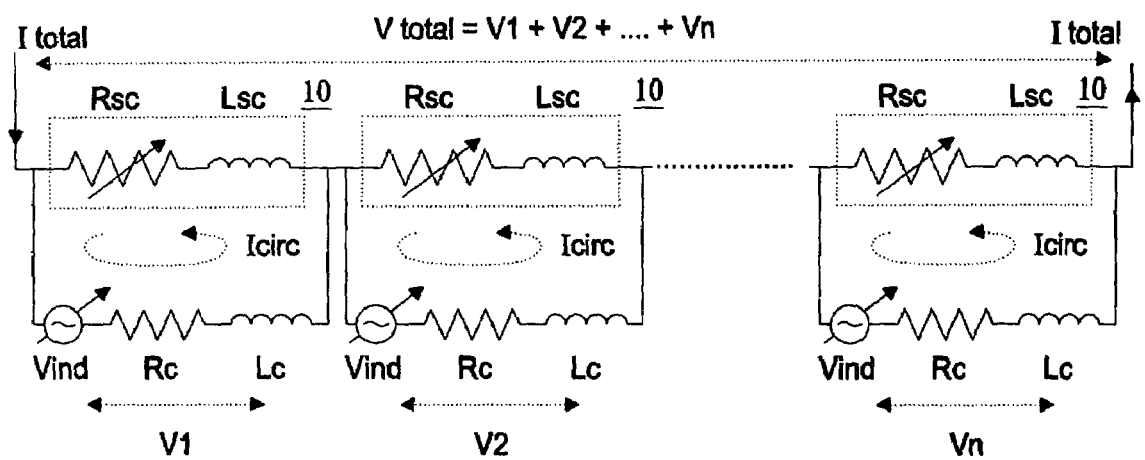
FIG. 4 illustrates an equivalent electrical schematic circuit of the series array arrangement of the present invention.
Figure 5:
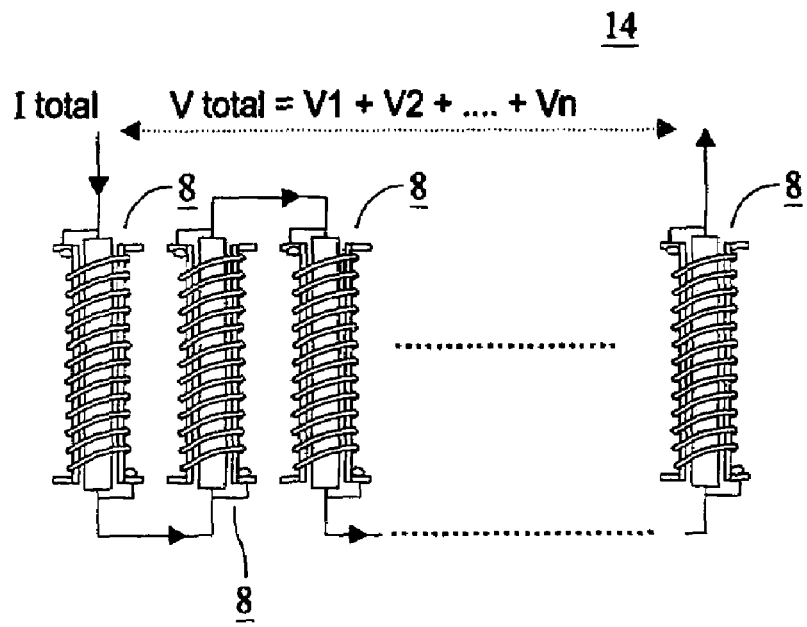
FIG. 5 illustrates a side view of the physical layout of the superconducting fault current limiter array of the present invention.
Figure 6:
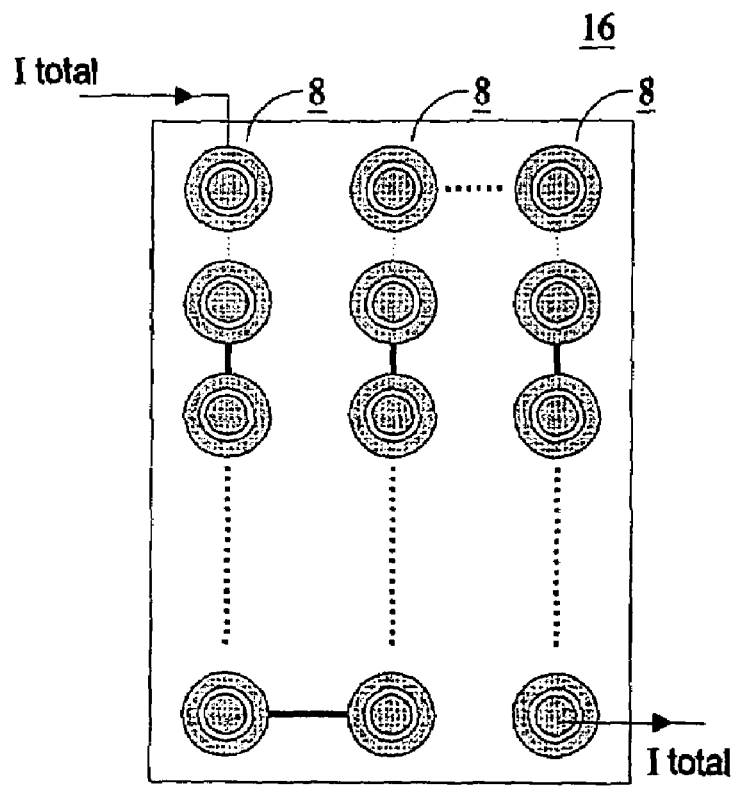
FIG. 6 illustrates a top view of the physical layout of the superconducting fault current limiter array of the present invention.

FIGS. 3 and 4 show simplified layout and equivalent circuit diagrams, when at least two SCFCL 8 are connected in series to an array fault current limiter. The physical layout, within a cryostat may be side by side SCFCL 8 arranged vertically as depicted in FIGS. 5 and 6 or alternatively may be provided in any orientation in a meander style or any other design or condition specific arrangement.

An optimized design, using SCFCL 10 will use design parameters such as, the trigger/shunt coil geometry, number of turns "N", angle of winding turns θ, and HTS 2 material properties and its physical dimensions. The radial clearance between the HTS element 2 and the trigger/shunt coil is designed so that the thermal cool-down of the whole assembly is optimized for thermal recovery of the surrounding cryogenic environment and recovery of both trigger/shunt coil 6 and the HTS element 2 after the current limiting duties, hence there will have to be a minimum radial clearance required depending on the fault current and energy dissipation. One of the design parameters is the relationship between the trigger magnetic field $B_{sc}$ and the thickness (cross-sectional) area of the HTS elements, in which the trigger magnetic field generated by the circulating current of the trigger/shunt coil has to exceed the self magnetic field of the HTS element, in order to be effective.

Generating circulating current results in power loss in the coil. The coil design parameters minimize the losses in the coil while optimizing the trigger magnetic field. In general, the circulating current is a small fraction of the total current, $I_{circ}$="p" times $I_{total}$, where "p" varies from nearly zero to 1, depending on the winding conductor angle, θ. When "p"≈0, there is negligible circulating current $I_{circ}$, which simulates trigger/shunt coil 6 with a compact winding used in a parallel trigger configuration. By design, "p" can be set to "p">0, so that the circulating current exists in the parallel circuit loop and generates a pre-trigger magnetic field to help triggering HTS 2 more uniformly and faster. The trigger/shunt coil can also be designed as a multi-layer winding of identical or different number of turns to optimize the magnetic field, optimize the induced voltage and minimize the I²r losses, so that effective triggering with minimum loss can be achieved.

An additional constant "k", is defined as a constant of proportionality of the induced voltage in the coil as a function of the current $I_{sc}$ through HTS 2

Vind=f(I_total, N, Coil geometry, θ)≈kNAd(Isc)/dt

Figure 7:
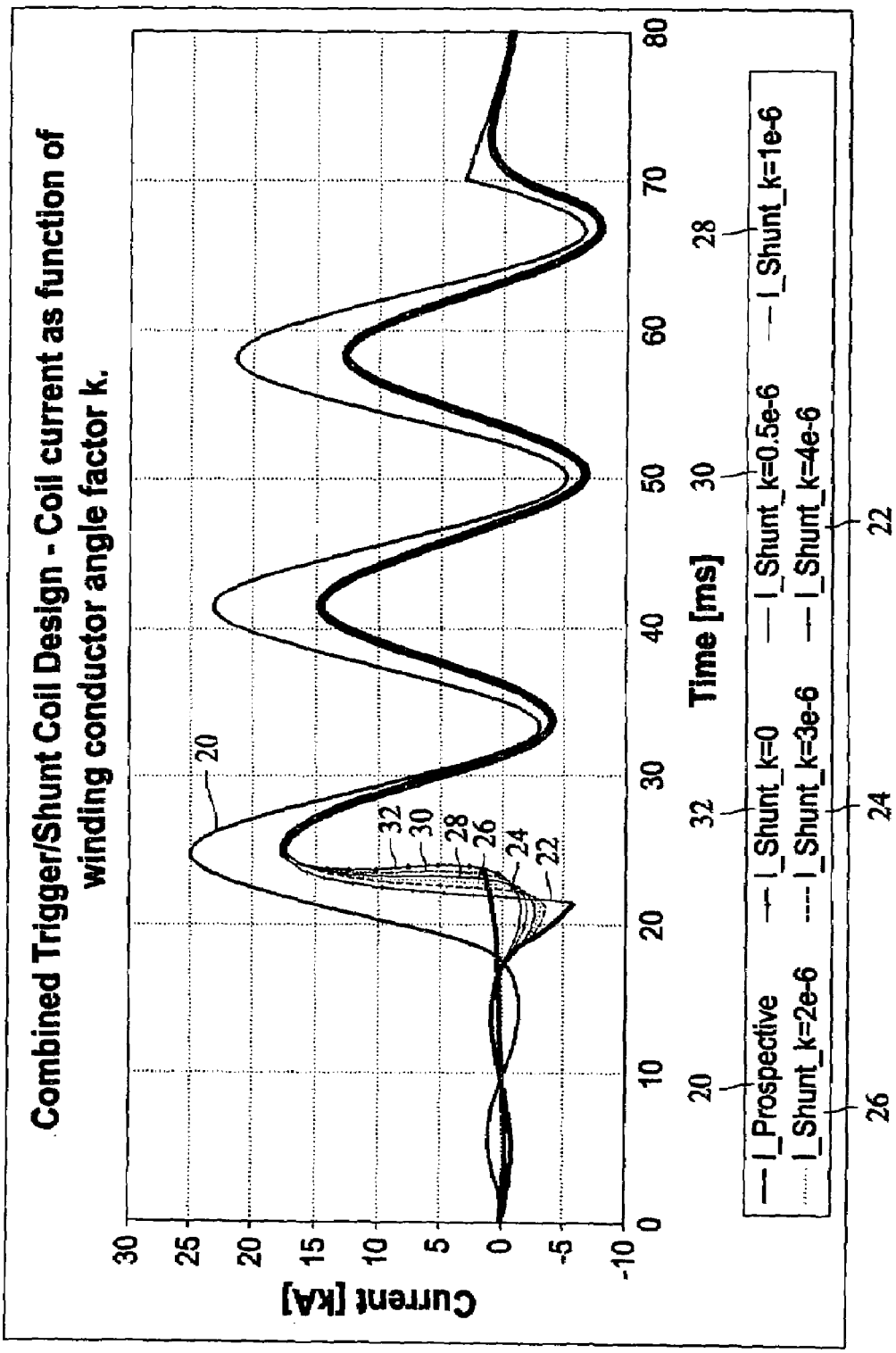
FIG. 7 illustrates a graphical plot of the simulated results of the improvement of coil current performance as the coefficient of induction "k" is increased in the present invention.
Figure 8:
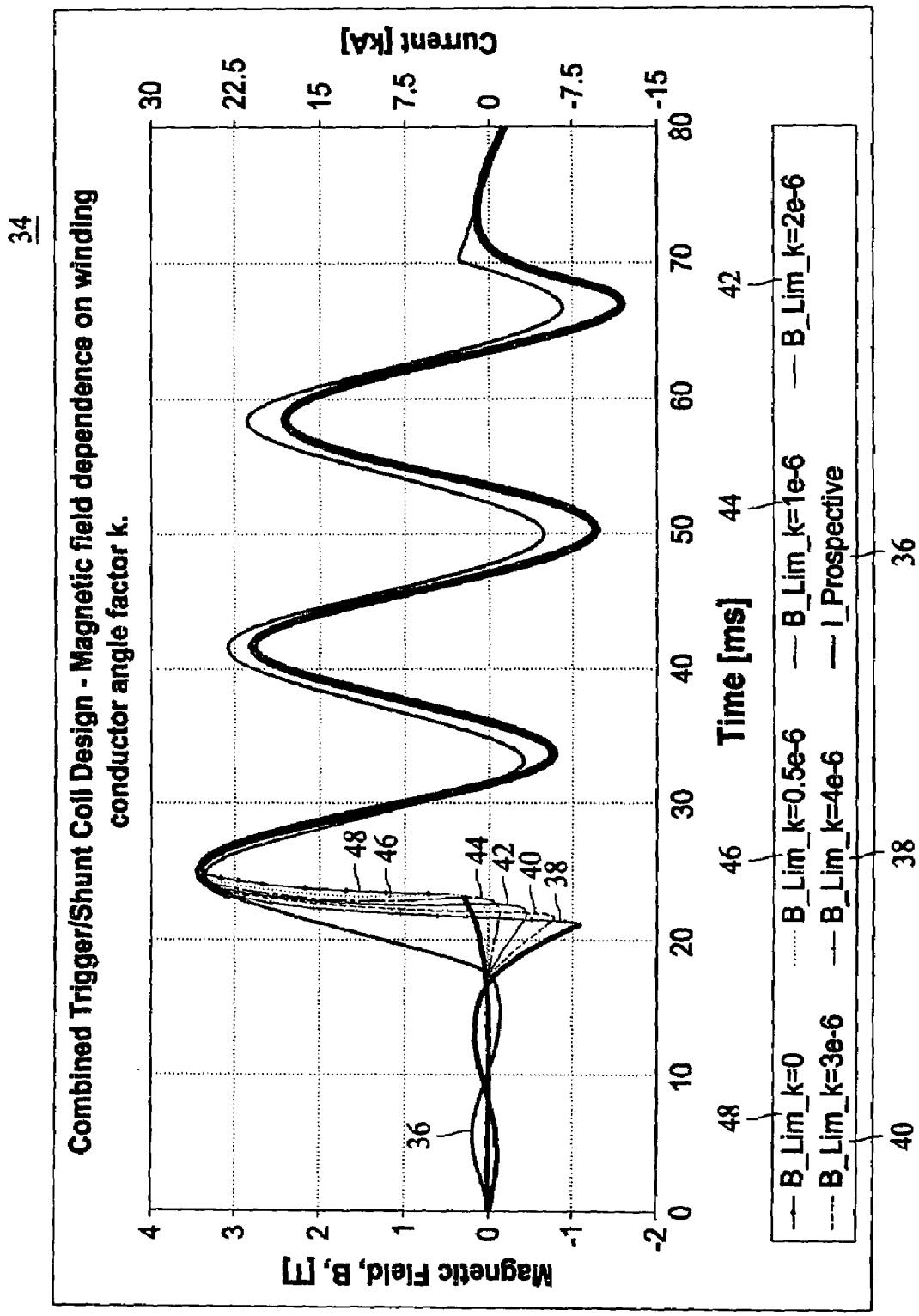
FIG. 8 illustrates a graphical plot of the simulated results of the improvement of magnetic field performance as the coefficient of induction "k" is increased in the present invention.

Next, simulation results of SCFCL 10 are described based on exemplary design parameters, wherein N=38 turns, Coil ID=48 mm, 240 mm long coil, with a 25 mm diameter and 200 mm long HTS element, during a short circuit fault condition with a prospective fault current having a 1$^{st}$ peak current of around 25 kA. FIG. 7 illustrates a plot of trigger/shunt coil current in kA verses time in milliseconds. A baseline factor "k" which represent the proportionality of the induced voltage $V_{ind}$ to a derivative of the superconductor current $I_{sc}$ in the equivalent circuit 10. A baseline is first established where the proportionality factor "k" is zero, which is identified as line 20. Next, the proportionality factor is increased incrementally from 0.5 e-6, line 30, 1e-6, line 28, 2e-6, line 26, 3e-6, line 24, and 4e-6, line 22. From the simulation results it is evident that as the proportionality factor is increased from zero to 4e-6, the trigger/shunt coil current increased, resulting in an increased pre-trigger magnetic field, as shown in FIG. 8.

Next simulation results of the invention are described based on exemplary design parameters, described above. FIG. 8 illustrates a plot of trigger/shunt coil magnetic field in Telsa verses time in milliseconds. Baseline factor "k" which represent the proportionality of the induced voltage $V_{ind}$ to a derivative of the superconductor Current $I_{sc}$ in the equivalent circuit 10. A baseline is first established where the proportionality factor "k" is zero, which is identified as line 36. Next, the proportionality factor is increased incrementally from 0.5 e-6, line 46, 1e-6, line 44, 2e-6, line 42, 3e-6, line 40, and 4e-6, line 38. From the simulation results it is evident that as the proportionality factor is increased from zero to 4e-6 the pre-trigger magnetic field increased, resulting in a faster and more uniform quench of the HTS element 2.

Figure 9:
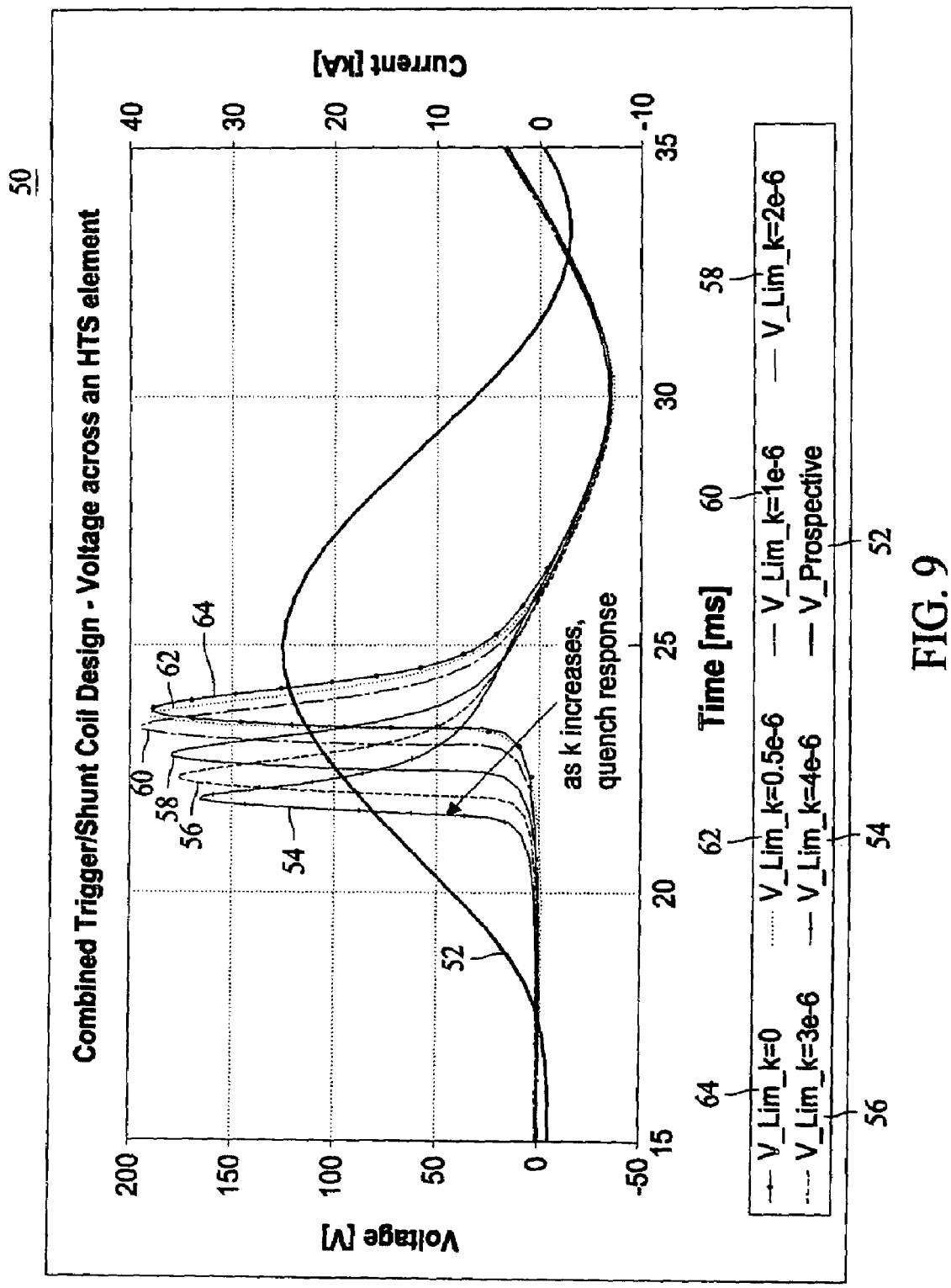
FIG. 9 illustrates a graphical plot of the simulated results of the improvement of voltage quenching response as the coefficient of induction "k" is increased in the present invention.

Next simulation results of the invention are described based on exemplary design parameters, described above. FIG. 9 illustrates a plot of trigger/shunt coil voltage verses time in milliseconds. A baseline factor "k" which represent the proportionality of the induced voltage $V_{ind}$ to a derivative of the superconductor current $I_{sc}$ in the equivalent circuit 10. A baseline is first established where the proportionality factor "k" is zero, which is identified as line 52. Next, the proportionality factor is increased incrementally from 0.5 e-6, line 62, 1e-6, line 60, 2e-6, line 58, 3e-6, line 56, and 4e-6, line 54. From the simulation results it is evident that as the proportionality factor is increased from zero to 4e-6 the system fault current limiter response time improves, that is, the HTS quenches faster during a fault condition.

Figure 10:
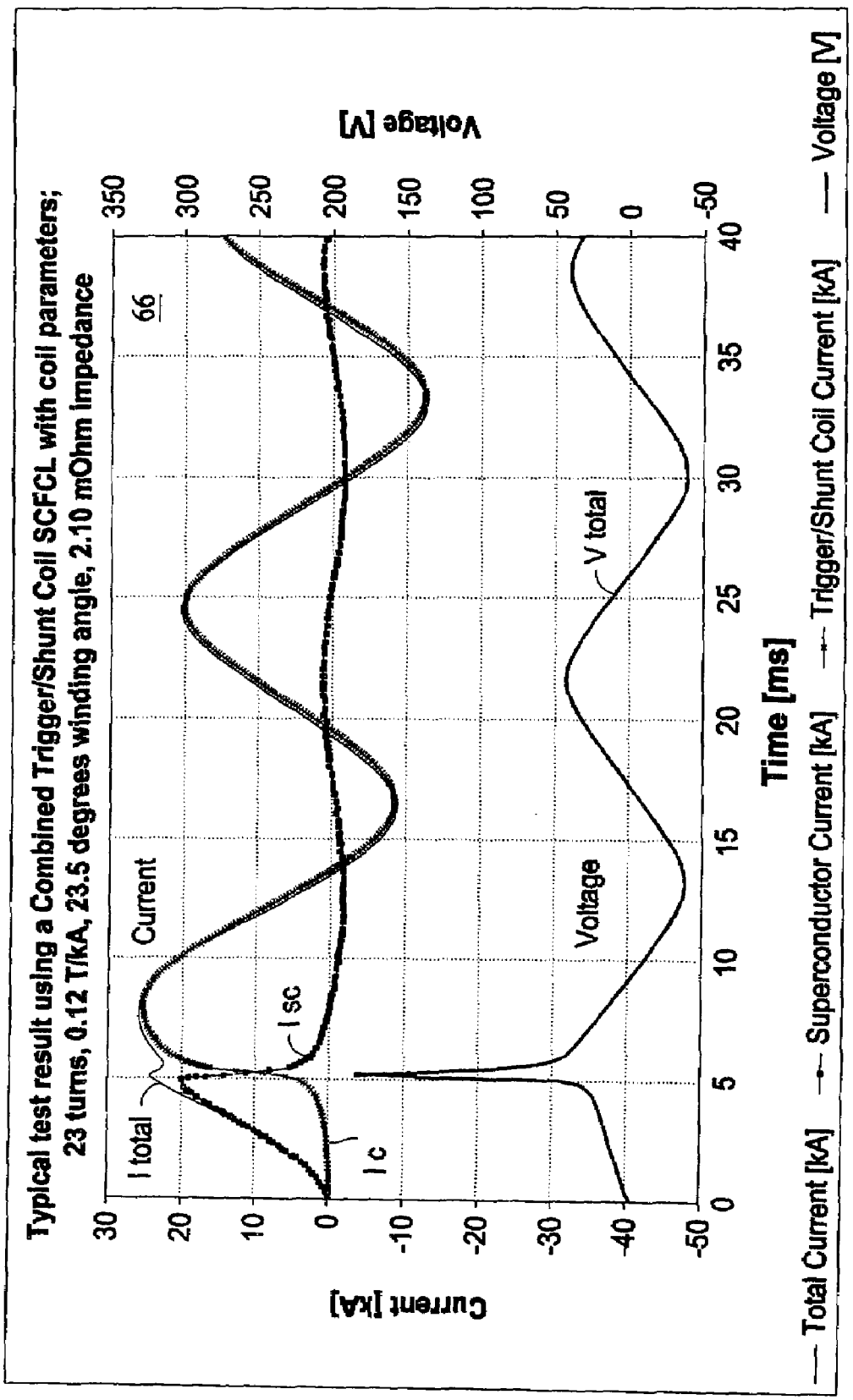
FIG. 10 illustrates a graphical plot of current and voltage waveforms of a typical test result obtained using a combined trigger/shunt coil SCFCL with coil parameters of; 23 turns, 0.12 Tesla/kA magnetic field, 23.5 degrees winding angle (θ), 2.10 mΩ impedance and 11 mm radial gap between Superconductor element and trigger/shunt coil of the present invention.
Figure 11:
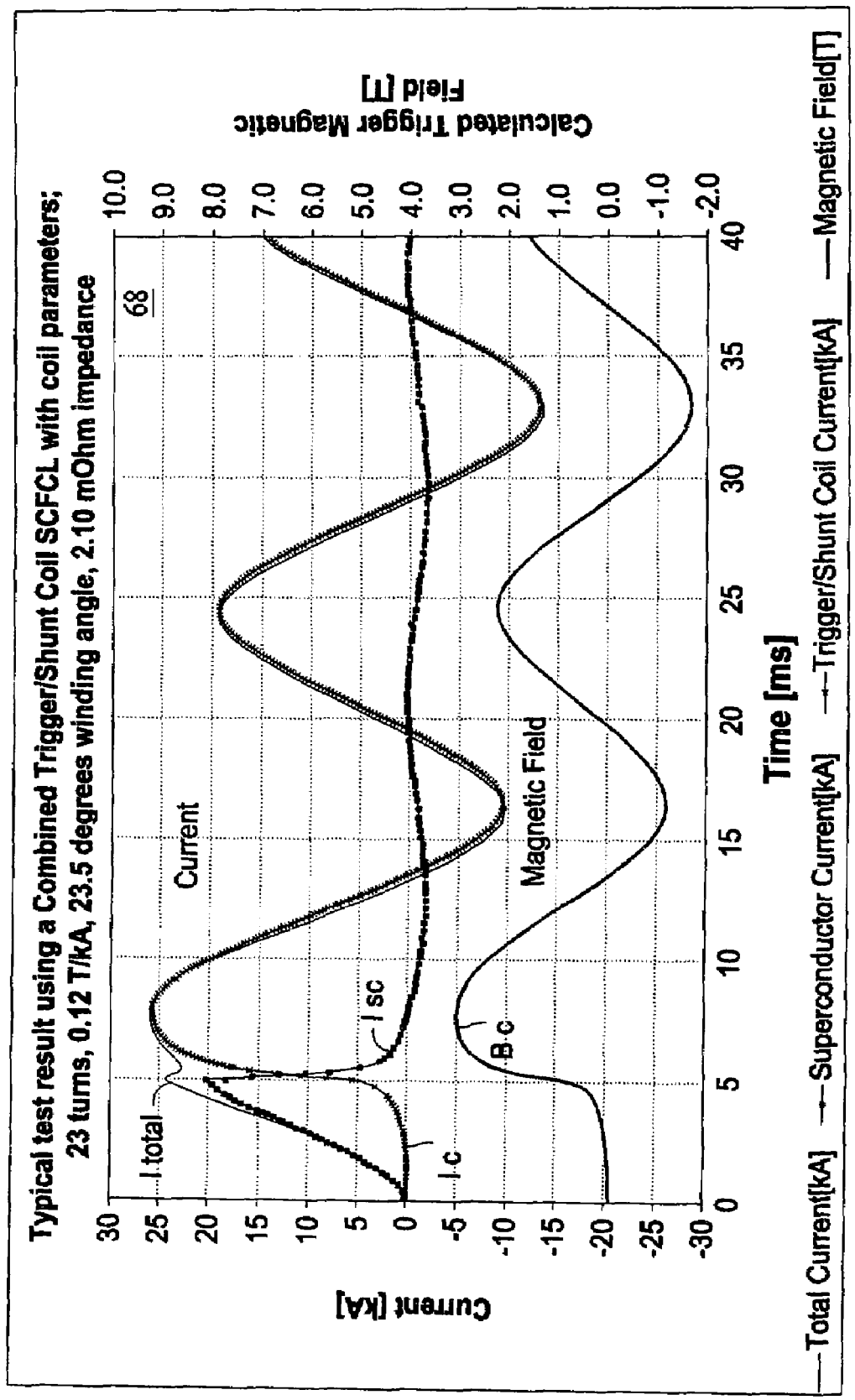
FIG. 11 illustrates a graphical plot of current and magnetic field response waveforms of a typical test result obtained using a combined trigger/shunt coil SCFCL with coil parameters of; 23 turns, 0.12 Tesla/kA magnetic field, 23.5 degrees winding angle (θ), 2.10 mΩ impedance and 11 mm radial gap between Superconductor element and trigger/shunt coil of the present invention.

In another exemplary embodiment of the present invention, test results demonstrate that the coil does not have to be tightly wound around the superconductor outer surface area, and therefore is said to be "loosely" wound around said superconductor, "loosely" wound is defined to mean having a predetermined gap between trigger/shunt coil 6 and superconductor 2 of at least 1 mm, and preferably 11 mm. In these test results the trigger/shunt coil 6 has an inner diameter of 48 mm and the HTS element 2 has a outside diameter of 26 mm, hence there is a 11 mm gap. Shunt coil turns "N" is 23 turns, the magnetic field is 0.12 T/kA, the winding angle θ is about 23 degrees, the shunt resistance $r_c$ is 2.10 m-ohms. FIG. 10 shows a plot 66 of the total current $I_{total}$, superconductor current $I_{sc}$, trigger/shunt current Ic, and voltage across the parallel circuit of superconductor and trigger/shunt coil Vtotal, during a short circuit fault condition applied for about 5 cycles. FIG. 11 shows a plot 68 of the total current $I_{total}$, superconductor current $I_{sc}$, trigger/shunt current Ic, and trigger/shunt magnetic field $B_c$ during a short circuit fault condition applied at about 5 cycles.

There are several benefits of the present invention, when compared to a conventional Matrix Fault Current Limiter (MFCL) design, such as that described in U.S. Pat. No. 6,664,875, which uses at least two separate coils for triggering and shunting, and uses a common connection for trigger coils grouped in a module or array. This invention also has advantages over a simple parallel trigger coil configuration where no provision for pre-trigger magnetic field is provided and no disclosure is provided for a lose fitting shunt coil, as recited in Publication US2005/0099253A1.

Benefits of the present invention include, negligible $i^2r$ losses during normal operation so as to have minimal impact on normal system operation, only one coil is employed for both trigger and shunt coil functions, where the magnetic field level is controlled by an additional parameter, the winding angle, θ, and other coil parameter and the impedance is designed to provide the required shunt impedance, a circulating current is used instead of using a separate coil for trigger coil, there is no common connection plate, which simplifies the electrical, mechanical and high voltage design. The electromagnetic interference effects are minimized between trigger and shunt coils, such as eddy losses, Lorenz forces, and induced voltage drops are minimized or in some configurations eliminated. The use of a single coil makes the design compact and reduced weight, resulting in a simplified design that provides for ease of manufacturing and increased reliability. For example, it is more convenient to build a single SCFCL 8, which has one HTS 2 element and one coil 6 to be connected in series or parallel in an FCL array 12.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A superconducting fault current limiter comprising;
a superconducting element having an outer surface and electrically coupled in parallel with a trigger/shunt coil;
wherein said trigger/shunt coil envelopes said superconducting element, said trigger/shunt coil having a plurality of coil turns disposed along the length of said superconducting element at an angle θ with respect to said superconducting element, wherein said angle θ is defined by a superconductor centerline along the length of said superconducting element having another orthogonal line perpendicular to said superconductor centerline, wherein the orthogonal line and a trigger/coil centerline define angle θ which is limited to a range from about five to about eighty-five degrees so as to generate a pre-fault circulating current $I_{circ}$ in said trigger/shunt coil when system current flows through said superconducting element;
wherein any one of said trigger/shunt coil turns is a distance greater than 1 mm from the outer surface of said superconductor.

2. The current limiter as recited in claim 1, wherein the circulating current $I_{circ}$ in said trigger/shunt coil is proportional to the total current $I_{total}$ of said superconducting element during both normal operation and fault conditions, wherein $I_{circ}$ is dependent on said angle θ.

3. The fault current limiter as recited in claim 1, wherein said superconductor, in non and alternatively low-inductive form, is selected from the group including rods, bars, plates, tape strips, wires, tubes, and bifilar coils.

4. The fault current limiter as recited in claim 1, wherein said trigger/shunt coil is made of electrically conductive materials and in configurations that are selected from the group including helically-wound solenoid coils, racetrack coils, and saddle coils and is wound from a single or multilayer windings of similar or different number of turns.

5. The fault current limiter as recited in claim 1 wherein said angle θ is preferably about twenty-three degrees and adapted to generate a circulating current $I_{circ}$ during normal and fault system operation.

6. The fault current limiter as recited in claim 1, wherein said fault current limiter is electrically coupled in series with at least one other said fault current limiter to form an array.

7. The fault current limiter, as recited in claim 1, wherein said fault current limiter is electrically coupled in parallel with at least one other said fault current limiter to form an array.

8. A superconducting fault current limiter comprising;
a superconducting element having an outer surface and electrically coupled in parallel with a trigger/shunt coil;
wherein said trigger/shunt coil loosely envelopes said superconducting element having a predetermined gap between said trigger/shunt coil and the outer surface of said superconducting element, said trigger/shunt coil having a plurality of coil turns disposed along the length of said superconducting element at an angle 74 with respect to said superconducting element, wherein said angle θ is defined by a superconductor centerline along the length of said superconducting element having another orthogonal line perpendicular to said superconductor centerline, a trigger/coil centerline in parallel with said trigger/shunt coil, wherein the orthogonal line and the trigger/coil centerline define angle θ, wherein angle θ is limited to a range from about five to about eighty-five degrees; said trigger/shunt coil disposed relative to said superconducting element to generate a pre-fault circulating current $I_{circ}$ in said trigger/shunt coil when system current flows through said superconducting element so as to generate a pre-fault magnetic field in said superconductor; and
wherein the trigger/shunt coil turns are a distance greater than 1 mm, and preferably 11 mm from the outer surface of said superconducting element.

9. The current limiter as recited in claim 8, wherein the circulating current $I_{circ}$ in said trigger/shunt coil is proportional to the total current $I_{total}$ of said superconducting element during both normal operation and fault conditions, wherein $I_{circ}$ is dependent on said angle θ.

10. The fault current limiter as recited in claim 8, wherein said angle θ is preferably about twenty-three degrees and adapted to generate a circulating current $I_{circ}$ during both normal and fault system operation.

11. The fault current limiter as recited in claim 8, wherein said fault current limiter is electrically coupled in series with at least one other said fault current limiter to form an array.

12. The fault current limiter, as recited in claim 8, wherein said fault current limiter is electrically coupled in parallel with at least one other said fault current limiter to form an array.

13. A superconducting fault current limiter array having at least one fault current limiter comprising;
- at least one superconducting element having an outer surface and electrically coupled in parallel with at least one trigger/shunt coil; wherein said at least one trigger/shunt coil loosely envelopes said at least one superconducting element having a predetermined gap greater than 1 mm between said at least one trigger/shunt coil and the outer surface of said at least one superconducting element; and
- wherein said at least one trigger/shunt coil has a plurality of coil turns disposed along the length of said at least one superconducting element at an angle $\theta$ with respect to said at least one superconducting element, wherein said angle $\theta$ is defined by a superconductor centerline along the length of said at least one superconducting element having another orthogonal line perpendicular to said superconductor centerline, a trigger/coil centerline in parallel with said at least one trigger/shunt coil, wherein the orthogonal line and the trigger/coil centerline define angle $\theta$, wherein angle $\theta$ is limited to a range from about five to about eighty-five degrees.

14. The fault current limiter array, as recited in claim 13, wherein said predetermined gap is preferably 11 mm.

15. The fault current limiter array as recited in claim 13, wherein said at least one fault current limiter is electrically coupled in series with at least one other said fault current limiter.

16. The fault current limiter array, as recited in claim 13, wherein said at least one fault current limiter is electrically coupled in parallel with at least one other said fault current limiter.

17. The fault current limiter array as recited in claim 13, wherein said at least one superconductor, in non and alternatively low-inductive form, is selected from the group including rods, bars, plates, tape strips, wires, tubes, and bifilar coils.

18. The fault current limiter array as recited in claim 13, wherein said at least one trigger/shunt coil is made of electrically conductive materials and in configurations that are selected from the group including helically-wound solenoid coils, racetrack coils, and saddle coils.

* * * * *